United States Patent [19]

Gragg, Jr.

[11] 4,317,126
[45] Feb. 23, 1982

[54] SILICON PRESSURE SENSOR

[75] Inventor: John E. Gragg, Jr., Paradise Valley, Ariz.

[73] Assignee: Motorola, Inc., Schaumburg, Ill.

[21] Appl. No.: 140,289

[22] Filed: Apr. 14, 1980

[51] Int. Cl.³ ............................................. H01L 29/84
[52] U.S. Cl. ....................................... 357/26; 357/55; 357/60; 338/4
[58] Field of Search .................. 357/26, 60, 55; 338/4

[56] References Cited

U.S. PATENT DOCUMENTS

| 3,918,019 | 11/1975 | Nunn | 357/26 X |
| 3,968,466 | 7/1976 | Nakamura | 357/26 X |
| 3,994,009 | 11/1976 | Hartlaub | 357/26 |
| 4,204,185 | 5/1980 | Kurtz | 338/4 |
| 4,275,406 | 6/1981 | Müller et al. | 357/26 |

OTHER PUBLICATIONS

Pfann et al., *Journ. of Appl. Phys.*, vol. 32, No. 10, Oct. 1961, pp. 2008-2019.

Primary Examiner—Martin H. Edlow
Attorney, Agent, or Firm—John A. Fisher

[57] ABSTRACT

A monolithic silicon pressure sensor employing a four-terminal resistive element is formed in a thin monocrystalline silicon diaphragm. The resistive element is a diffused resistor having current contacts at the ends and two voltage contacts located midway between the current contacts and on opposite sides of a current axis defined between the two current contacts. The thin silicon diaphraghm has a square shape and is oriented in a (100) silicon surface with its sides parallel to a [110] crystal orientation. The resistor is oriented with its current axis parallel to a [100] crystalline direction and at 45 degrees with respect to the edge of the diaphragm to maximize sensitivity of the resistor to shear stresses generated by flexure of the diaphragm resulting from pressure differentials across the diaphragm. With a current flowing between current contacts, a shear stress acting on the resistor generates a voltage which appears at the voltage contacts and which is proportional to the magnitude of the shear stress.

17 Claims, 3 Drawing Figures

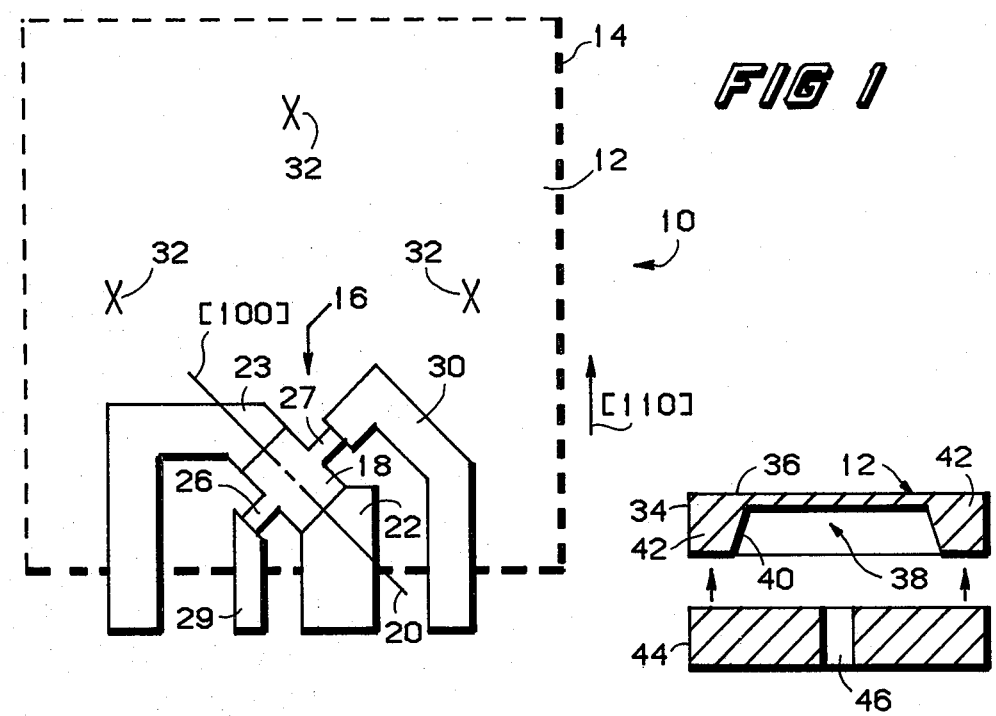
FIG 1
FIG 2
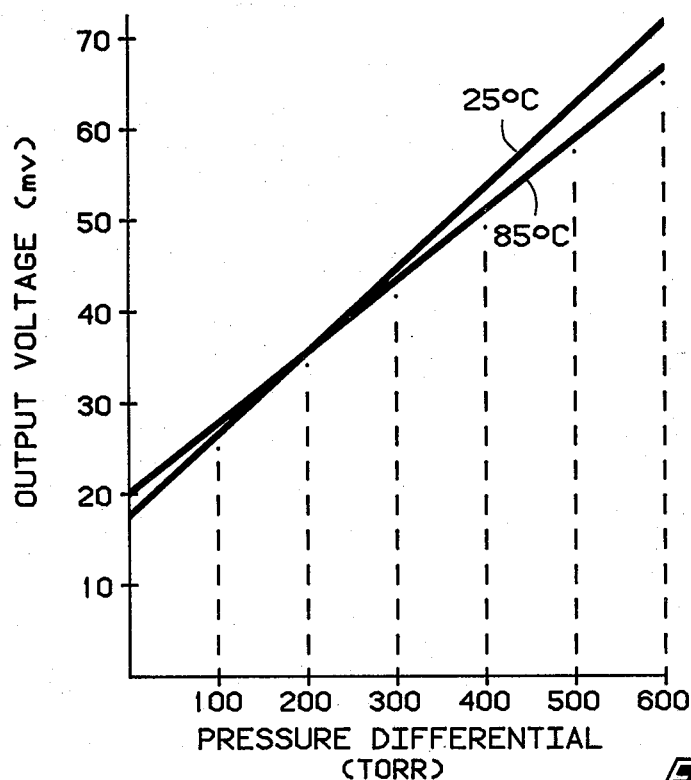
FIG 3

SILICON PRESSURE SENSOR

BACKGROUND OF THE INVENTION

This invention relates in general to a monolithic silicon pressure sensor and more particularly to a single element pressure sensor which utilizes the shear stress piezoresistive effect in silicon.

The resistance value of a properly oriented silicon resistor is known to change in response to a flexing of the silicon crystal. This piezoresistive response has been utilized to fabricate pressure transducers. A differential pressure applied across a silicon diaphragm in which a resistor is formed causes a change in the resistor value. Measurements of the resistance change are proportional to changes in the differential pressure.

In the past it has not been found practical to use a single resistor as a pressure sensor. In general, the percentage change in resistance of the single resistor transducer is too low to be practical; the small signal that is generated requires sensitive amplifiers and engenders problems relating, for example, to noise. A more conventional approach has been, therefore, to arrange four resistors in a Wheatstone bridge configuration. Small changes in the individual resistance values contribute to a significant offset in the bridge and provide an easily detectible signal. A series of other problems, however, confront the Wheatstone bridge approach. The four resistors used for the bridge must be closely matched in value to avoid a zero offset; that is, a non-zero output for zero applied pressure differential. For diffused resistors this requires that both the geometry and diffusion parameters be controlled and uniform. More importantly the four resistors must have the same temperature coefficient; that is, the resistance value of each component must change with temperature in the same fashion. While it is possible, although undesirable, to correct for differences in component values which lead to a zero offset, it is very difficult to correct for differences in thermal coefficient. If the temperature coefficients of the four resistors are not identical each component will change in some different manner, changing the zero offset as the temperature changes.

In addition, most applications require that the pressure transducer have an output which is approximately linear with changes in pressure. The Wheatstone bridge generally has a relatively low output when designed for linear response, and low outputs are generally characterized by difficulties with noise and need for amplification.

Accordingly, in view of the disadvantages associated with Wheatstone bridge and other prior art pressure transducers, a need existed for an improved pressure transducer. It is therefore an object of this invention to provide a silicon pressure transducer which does not require matching of transducer components.

It is a further object of this invention to provide a silicon pressure transducer having improved reproducibility and improved temperature coefficient of response.

It is a still further object of this invention to provide a silicon pressure transducer having a small zero pressure differential offset.

SUMMARY OF THE INVENTION

The foregoing and other objects and advantages of the invention are achieved through the use of a single, four contact resistor element oriented to maximize response to pressure induced stresses through shear stress effects. To maximize these effects the resistor is formed in a silicon membrane having a (100) surface orientation; the edges of the membrane are oriented along [110] crystalline directions; and the resistor is provided with current contacts which allow forcing of a current along a current axis oriented at 45° with respect to the membrane edge. A transverse voltage generated in response to pressure induced stresses can be detected at voltage contacts located at the edge of the resistor. The voltage is generated along a line perpendicular to the current axis.

BRIEF DESCRIPTION OF THE DRAWINGS

FIG. 1 is a plan view of a pressure transducer in accordance with the invention.

FIG. 2 illustrates in cross section a portion of a silicon wafer and depicts the fabrication of a pressure transducer.

FIG. 3 illustrates output voltage of the sensor in response to applied pressure differential.

DETAILED DESCRIPTION OF THE PREFERRED EMBODIMENTS

FIG. 1 illustrates a plan view of a pressure transducer in accordance with the invention. The transducer is formed in a silicon membrane or diaphragm 12 having a (100) surface orientation. The membrane has a rectangular, and preferably a square, shape. The sides of the membrane indicated by the dashed line 14 are oriented parallel to [110] crystalline direction. References to crystallographic orientations and directions are consistent with conventions well known in the semiconductor art.

A transducer element 16 is formed in membrane 12 by diffusion, ion implantation, or the like. Transducer element 16 comprises an elongated resistor portion 18 which is oriented along a current axis 20. The current axis is oriented along a [100] crystalline direction and forms a 45° angle with an edge of the membrane. Current contacts 22, 23 make electrical contact to the ends of resistor 18. The current contacts are preferably made by a heavily doped, high conductivity diffusion which provides a low impedance path from the ends of resistor 18 to a location outside diaphragm 12.

Voltage taps 26, 27 are positioned along the two sides of resistor 18 approximately midway along the length of the resistor. The voltage taps allow the detection and measurement of a transverse voltage generated in response to a flexing of diaphragm 12 when a current flows along current axis 20. Ohmic contact to voltage taps 26, 27 are made by voltage contacts 29, 30, respectively. The voltage contacts are preferably heavily doped, high conductivity regions which extend from the voltage taps to a position outside diaphragm 12.

Transducer element 16 is positioned close to the edge of the diaphragm at a position midway along the diaphragm edge. This position, in combination with the orientation of the current axis along a [100] direction, maximizes shear stress in the resistor while minimizing longitudinal and transverse stresses along the current axis. Mathematically the response of the transducer element can be described by the equations:

$$E_1' = \rho_o i_1' [1 + \pi'_{11}\sigma_1' + \pi'_{12}\sigma_2']$$

$$E_2' = \rho_o i_1' \pi'_{44} \tau'_{12}$$

where $i'_1$ is the current density flowing parallel to the applied field $E_1$, $\rho_o$ is the resistance of the body;

$E'_2$ is the voltage perpendicular to the current;

$\sigma'_1$ is the stress parallel to the current;

$\sigma'_2$ is the stress perpendicular to the current; and $\tau'_{12}$ is the shear stress in the plane of the resistor.

The coefficients $\pi'_{11}$, $\pi'_{12}$, and $\pi'_{44}$ are the piezoresistive coefficients transformed to a coordinate system defined by the current axis, the perpendicular to the current axis, and the wafer normal. These results assume a state of plane stress, a valid approximation for a thin membane considered here. As indicated, a shear stress $\tau'_{12}$ produces a voltage $E'_2$ at right angles to the current axis. The orientation and location of transducer element 16 are selected to maximize $\pi'_{44}$ and to simultaneously minimize $\pi'_{11}$ and $\pi'_{12}$.

A pressure differential across the diaphragm will therefore produce a voltage detectible at voltage taps 26, 27 which is proportional to the magnitude of the pressure differential. This can be characterized as a physicalanalog to a Hall device, where the piezoresistive coefficient $\pi'_{44}$ replaces the Hall coefficient $R_H$ and the shear stress $\tau'_{12}$ replaces the magnetic field strength B.

Because of symmetries in the silicon crystal, element 16 could equally be placed at any of the locations 32 shown in FIG. 1 by an "X". Each of these locations is crystallographically equivalent and for a square diaphragm is also mechanically equivalent. The position near but not at the edge of the diaphragm is selected to maximize the shear stress effect without encountering undesirable edge or boundary effects.

FIG. 2 illustrates in cross-section a preferred embodiment for implementing a pressure transducer in accordance with the invention. The transducer is formed in an n-type silicon wafer 34 having a resistivity of about 1-10 Ohm-cm and a (100) crystallographic surface orientation. The resistor element is formed, in a preferred embodiment, in the surface 36 of the wafer by conventional photolithographic and diffusion techniques. The p-type resistor is diffused to a depth of about 3 micrometers and has a sheet resistivity of about 200-300 Ohms per square.

The current contacts and contacts to voltage taps are high concentration p-type diffusions having a resistivity of about 10-20 Ohms per square. The contact diffusion is of sufficiently high conductivity to not appreciably interfere with the operation of the transducer element itself. Contact to the voltage taps and to the current contacts can also be made by means of metallic leads contacting the transducer element itself, but the use of metallization directly on the thin silicon diaphragm can lead to problems relating to temperature coefficient. The metal directly on the silicon diaphragm tends to form a bimetallic structure which results in undesirable perturbations as the temperature environment changes.

A recess 38 is etched in the back side of wafer 34 to form the thinned diaphragm region 22. The recess can be etched, for example, using an anisotropic silicon etchant such as an aqueous solution of potassium hydroxide and isopropyl alcohol. The potassium hydroxide mixture rapidly etches (100) planes in preference to (111) planes. As a result, a planar diaphragm 12 is formed in the (100) oriented wafer. The recess 38 is bounded at its edges 40 by (111) planes. The thick silicon regions 42 at the edges of the diaphragm serve to bound or constrain the edges of the diaphragm. The thick silicon regions also provide mechanical strength to the transducer. For a transducer useful in the pressure range of about one atmosphere, the diaphragm preferably has a thickness of about 25 μm and is about 1.4 mm on a side. The diffused resistor is located with its closest portion about 80-120 μm from the edge of the diaphragm.

After metallizing the transducer to facilitate contact from heavily diffused regions 22, 23, 29, and 30 to circuitry external to the transducer and the optional passivating of the transducer surface with an insulator layer, the transducer wafer 34 is joined to a backing wafer 44. The two wafers are sealed together, for example, by a low temperature glass frit sealing process usually carried out in a vacuum. By this process a sealing glass mixture is applied to wafer 44. In an evacuated enclosure the two wafers are pressed together and heated to a temperature sufficient to melt the sealing glass.

The transducer so formed is suitable for use as either an absolute or a differential pressure sensor. To form the differential sensor, wafer 44 is provided with a hole 46 which aligns with recess 38. The sensor is then packaged to expose front surface 36 to a first pressure and the underside of the diaphragm, through hole 46, to a second pressure. Differences in those two pressures causes a flexing of diaphragm 12.

An absolute pressure sensor is formed by an integral wafer 44 without holes. During the sealing process, accomplished in a vacuum or at other known desired pressure, that pressure is sealed within recess 38 and provides a reference pressure against which pressures proximate the front surface 36 are compared. Pressures different from the reference pressure cause a flexing of the diaphragm which is proportional to that pressure difference. The proportionate flexing, in turn, causes a voltage to appear at the voltage taps which is proportional to the pressure difference.

While FIG. 2 illustrates the fabrication of a single transducer, a plurality of such devices are normally fabricated simultaneously in wafer 34 in a manner well known in the semiconductor industry. The individual devices are then separated, for example, by sawing the wafer into dice, each containing one transducer.

The output response from a pressure sensor fabricated in accordance with the invention is illustrated in FIG. 3. The voltage output measured at the voltage taps is shown as a function of applied pressure differential. The applied exitation voltage is about 3 volts. Measurements taken at two different temperatures are shown; the maximum deviation from linearity is less than about 35 μV.

There has thus been provided, in accordance with the invention, a silicon pressure transducer which comprises a single, four-contact piezoresistive element sensitive to shear stresses. The resistor element and the diaphragm in which it is formed are oriented to maximize output in response to applied pressure changes.

The invention has been described by reference to a particular embodiment, but the invention is not to be interpreted as being so limited. The particular embodiment described is particularly suited to the measurement of pressure differences in the order of zero to fifteen pounds per square inch. A similar sensor can be fabricated for higher or lower nominal pressure differences by increasing or decreasing the thickness and/or size of the diaphragm.

Reference has been made to specific preferred crystalline orientations and directions. It will be appreciated by those skilled in the art that some variation in these directions and orientation still falls within the spirit of the invention. Acceptable results are obtained when the orientations and directions are maintained to within about ±10-15 percent of those specified, preferably directions and orientations will be maintained within about ±2-3 percent.

Additionally, specific examples of diffusion results have been specified by way of illustration. Other resistivities, diffusion depths and doping levels for example, can also be used to optimize the transducer device for a particular application.

Accordingly, it is intended that all such alternatives and modifications fall within the scope and spirit of the following claims:

I claim:

1. A silicon pressure transducer comprising: a silicon diaphragm of first conductivity type capable of flexing in response to changes in pressure; a diffused region in said diaphragm of opposite conductivity type; first and second electrical terminals to said diffused region by which a current can be forced through said region in the plane of said diaphragm; third and fourth electrical terminals to said diffused region located on opposite sides of and along a line approximately perpendicular to a line between said first and second terminals, said third and fourth electrical terminals permitting the detection and measurement of a voltage generated in response to a pressure being applied to and causing flexure of said diaphragm.

2. The transducer of claim 1 wherein said diaphragm is rectangular in shape.

3. The transducer of claim 1 wherein said diaphragm is approximately square in shape.

4. The transducer of claim 3 wherein said diaphragm is bounded at the edges of the square.

5. The transducer of claim 3 wherein said diaphragm is oriented in a (100) silicon plane.

6. The transducer of claim 5 wherein said diaphragm has an edge oriented in a [100] direction.

7. The transducer of claim 6 wherein said diffused region is cross shaped, having first and second portions oriented approximately perpendicular to each other.

8. The transducer of claim 7 wherein said first and second electrical terminals contact said first portion and said third and fourth terminals contact said second portion.

9. The transducer of claim 7 wherein said first portion is oriented at approximately 45° to an edge of said diaphragm.

10. The transducer of claim 3 wherein said region is located proximate to an edge of said diaphragm.

11. The transducer of claim 1 wherein said diaphragm is n-type and said diffused region is p-type.

12. A silicon pressure sensor comprising: a monocrystalline silicon diaphragm of first conductivity type having a square shape, said diaphragm having a (100) surface orientation and having sides oriented in [110] crystalline directions; a resistor of opposite conductivity type diffused into said diaphragm having current contact areas at the ends thereof, a line between said current contact areas forming a current axis, and first and second voltage contact areas positioned at opposite sides of said resistor.

13. The pressure sensor of claim 12 wherein said resistor is positioned in said diaphragm with said current axis oriented in a [100] crystalline direction at approximately 45° with respect to one of said sides.

14. The pressure sensor of claim 12 wherein said diaphragm is n-type and said resistor is p-type.

15. The pressure sensor of claim 12 wherein said diaphragm is formed by etching a cavity in a silicon wafer to leave said diaphragm unetched.

16. The pressure sensor of claim 15 wherein said silicon wafer in which a cavity is etched is sealed to a second silicon wafer.

17. The pressure sensor of claim 16 wherein said second silicon wafer is provided with a hole therein aligned with said cavity in said first wafer.

* * * * *

UNITED STATES PATENT AND TRADEMARK OFFICE
CERTIFICATE OF CORRECTION

PATENT NO. : 4,317,126
DATED : Feb. 23, 1982
INVENTOR(S) : GRAGG, JOHN E., JR.

It is certified that error appears in the above—identified patent and that said Letters Patent is hereby corrected as shown below:

Claim 6, line 2, change "[100]" to read "[110]"

COLUMN 3, LINE 61, change "region 22" to read "region 12".

Signed and Sealed this

First Day of June 1982

[SEAL]

Attest:

Attesting Officer

GERALD J. MOSSINGHOFF
Commissioner of Patents and Trademarks